(12) United States Patent
Chandolu et al.

(10) Patent No.: US 11,631,630 B2
(45) Date of Patent: Apr. 18, 2023

(54) PILLAR-LAST METHODS FOR FORMING SEMICONDUCTOR DEVICES

(71) Applicant: Micron Technology, Inc., Boise, ID (US)

(72) Inventors: Anilkumar Chandolu, Boise, ID (US); Wayne H. Huang, Boise, ID (US); Sameer S. Vadhavkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 17/175,006

(22) Filed: Feb. 12, 2021

(65) Prior Publication Data
US 2021/0166996 A1     Jun. 3, 2021

Related U.S. Application Data

(62) Division of application No. 15/858,501, filed on Dec. 29, 2017, now Pat. No. 10,957,625.

(51) Int. Cl.
*H01L 23/48* (2006.01)
*H01L 23/00* (2006.01)
*H01L 25/065* (2023.01)
*H01L 21/683* (2006.01)
*H01L 23/31* (2006.01)

(52) U.S. Cl.
CPC ........ *H01L 23/481* (2013.01); *H01L 21/6835* (2013.01); *H01L 24/03* (2013.01);
(Continued)

(58) Field of Classification Search
CPC ................................ H01L 24/03; H01L 24/11
See application file for complete search history.

(56) References Cited

U.S. PATENT DOCUMENTS

| | | |
|---|---|---|
| 2008/0153204 A1 | 6/2008 | Jackson et al. |
| 2012/0086122 A1 | 4/2012 | Cheng et al. |
| 2013/0087920 A1* | 4/2013 | Jeng ............... H01L 23/49827 257/773 |

(Continued)

FOREIGN PATENT DOCUMENTS

| | | |
|---|---|---|
| WO | 2012037140 A2 | 3/2012 |
| WO | 2014172835 A1 | 10/2014 |

OTHER PUBLICATIONS

International Application No. PCT/US2018/056355—International Search Report and Written Opinion, dated Feb. 13, 2019, 12 pages.
TW Patent Application No. 107138485—Taiwanese Office Action and Search Report, dated Dec. 27, 2019, with English Translation, 27 pages.

*Primary Examiner* — Robert G Bachner
*Assistant Examiner* — Molly K Reida
(74) *Attorney, Agent, or Firm* — Perkins Coie LLP

(57) ABSTRACT

Semiconductor devices having one or more vias filled with an electrically conductive material are disclosed herein. In one embodiment, a semiconductor device includes a semiconductor substrate having a first side, a plurality of circuit elements proximate to the first side, and a second side opposite the first side. A via can extend between the first and second sides, and a conductive material in the via can extend beyond the second side of the substrate to define a projecting portion of the conductive material. The semiconductor device can have a tall conductive pillar formed over the second side and surrounding the projecting portion of the conductive material, and a short conductive pad formed over the first side and electrically coupled to the conductive material in the via.

20 Claims, 8 Drawing Sheets

(52) U.S. Cl.
CPC .............. *H01L 24/05* (2013.01); *H01L 24/11* (2013.01); *H01L 24/13* (2013.01); *H01L 25/0657* (2013.01); *H01L 23/3128* (2013.01); *H01L 2221/68304* (2013.01); *H01L 2224/0346* (2013.01); *H01L 2224/0401* (2013.01); *H01L 2224/05025* (2013.01); *H01L 2224/05568* (2013.01); *H01L 2224/1146* (2013.01); *H01L 2224/13006* (2013.01); *H01L 2224/13023* (2013.01); *H01L 2225/0652* (2013.01); *H01L 2225/06513* (2013.01); *H01L 2225/06517* (2013.01); *H01L 2225/06541* (2013.01)

(56) References Cited

U.S. PATENT DOCUMENTS

| | | |
|---|---|---|
| 2013/0154112 A1 | 6/2013 | Zhang et al. |
| 2014/0357074 A1 | 12/2014 | Kim et al. |
| 2015/0048496 A1 | 2/2015 | Chiu et al. |
| 2015/0270220 A1* | 9/2015 | Moon .................. H01L 21/304 257/737 |
| 2015/0287687 A1 | 10/2015 | Farrens et al. |
| 2016/0163620 A1 | 6/2016 | Oganesian et al. |
| 2017/0011948 A1 | 1/2017 | Farrens et al. |
| 2019/0206766 A1 | 7/2019 | Chandolu et al. |

\* cited by examiner

PILLAR-LAST METHODS FOR FORMING SEMICONDUCTOR DEVICES

CROSS-REFERENCE TO RELATED APPLICATION

This application is a division of U.S. patent application Ser. No. 15/858,501, filed Dec. 29, 2017; which is incorporated herein by reference in its entirety.

TECHNICAL FIELD

The present technology generally relates to semiconductor devices having through-silicon vias (TSVs), and more particularly relates to systems and methods for manufacturing semiconductor devices having conductive pillars electrically coupled to TSVs.

BACKGROUND

In semiconductor processing, through-silicon vias (TSVs) are often used to provide electrical connection between adjacent semiconductor dies. Fabrication of TSVs involves etching deep holes into a front side of a semiconductor substrate, and filling the resulting holes with a conductive fill such as copper. Often, conductive pillars are then formed to be electrically coupled to the conductive fill of the TSVs at the front side of the substrate, and the substrate is thinned from its back side until the conductive fill is exposed. Under-bump metallization (UBM) features are then formed over the exposed conductive material of the TSVs at the back side of the substrate.

More particularly, FIGS. 1A-1G are cross-sectional views illustrating various stages in a method of manufacturing a semiconductor device 100 in accordance with the prior art. As shown in FIG. 1A, the semiconductor device 100 includes a substrate 102 having a front side 107, a back side 109 opposite the front side, and a plurality of circuit elements 104 (e.g., wires, traces, interconnects, transistors, etc.) in and/or on the front side 107. For example, metal traces can be formed on the front side 107 of the substrate 102, while integrated circuit elements can be located in the substrate 102 beneath the metal traces. FIG. 1A further shows the semiconductor device 100 after TSVs 106 have been formed in the substrate 102. In particular, the TSVs extend from the front side 107 into the substrate 102 but are not yet accessible at the back side 109. The TSVs 106 can be formed using well known processes in the art. For example, the TSVs can be fabricated by forming holes in the substrate 102 and filling the holes with a conductive material 105.

FIG. 1A further shows the semiconductor device 100 after conductive pillars 108 have been formed on the front side 107 of the substrate 102 to be electrically coupled to the conductive material 105 of corresponding ones of the TSVs 106. The conductive pillars 108 are relatively tall structures having a height above the front side 107 of the substrate 102 of between about 10-100 µm (e.g., between about 35-60 µm). The conductive pillars 108 can be fabricated by a suitable electroplating or electroless plating process, as is well known in the art. In other embodiments, other deposition techniques (e.g., sputter deposition) can be used in lieu of electroplating or electroless plating.

FIG. 1B shows the semiconductor device 100 after the substrate 102 has been attached to a carrier 110 (e.g., a silicon carrier) via an adhesive layer 112. The carrier 110 can be used to provide additional stability throughout intermediate processing steps on the back side 109 of the substrate 102, and can later be removed along with the adhesive layer 112. As shown in FIG. 1B, the adhesive layer 112 has a thickness that is greater than the height of the conductive pillars 108 and can therefore be formed to entirely surround the conductive pillars 108. Accordingly, the adhesive layer 112 can have a thickness of between about 10-100 µm (e.g., between about 35-60 µm). As illustrated in FIG. 1B, forces exerted on the carrier 110 by the relatively thick adhesive layer 112 can cause the carrier 110 to warp. In particular, adhesive forces imparted by the adhesive layer 112 can cause the carrier 110 to warp such that a back side 119 of the carrier 110 is substantially not coplanar. Before further processing steps can be carried out on the back side 109 of the substrate 102, the carrier 110 must be planarized to, for example, permit accurate handling and alignment of the carrier 110 (and the semiconductor device 100 attached thereto) during subsequent processing stages. Accordingly, FIG. 1C illustrates the carrier 110 and the semiconductor device 100 after the back side 119 of the carrier 110 has been planarized to be generally coplanar.

FIG. 1D shows the semiconductor device 100 after the back side 109 of the substrate 102 has been thinned to expose the conductive material 105 of the TSVs 106 through the back side 109 of the substrate 102. The substrate 102 can be thinned using, for example, a suitable backgrinding process known in the art. As shown in FIG. 1D, after thinning the substrate 102, a portion of the conductive material 105 of the TSVs 106 may project beyond the back side 109 of the substrate 102.

FIG. 1E shows the semiconductor device 100 after a dielectric layer 114 has been deposited over the back side 109 of the substrate 102 and over the exposed portions of the conductive material 105 of the TSVs 106. The dielectric layer 114 may comprise $SiO_x$ material (e.g., silicon dioxide), tetraethyl orthosilicate (TEOS), other oxide materials, etc. As shown in FIG. 1F, the dielectric layer 114 and/or the exposed portions of the conductive material 105 of the TSVs 106 are subsequently thinned to co-planarize the exposed portions of the conductive material 105 and the dielectric layer 114. Therefore, after thinning, the conductive material 105 of the TSVs 106 and the dielectric layer 114 together define a planar back side 115 of the semiconductor device 100. Thinning is typically achieved using a chemical mechanical planarization (CMP) process.

FIG. 1G shows the semiconductor device 100 after UBM features 116 have been formed on the back side 115 of the semiconductor device 100 to be electrically coupled to the conductive material 105 of corresponding ones of the TSVs 106. The UBM features 116 are relatively short features compared to the conductive pillars 108, having a height above the back side 115 of the semiconductor device 100 of between about 1-10 µm (e.g., between about 1-5 µm). The conductive pillars 108 can be fabricated by a suitable electroplating or electroless plating process, as is well known in the art. In other embodiments, other deposition techniques (e.g., sputter deposition) can be used in lieu of electroplating or electroless plating. FIG. 1G further illustrates the semiconductor device 100 (i) after the carrier 110 and the adhesive layer 112 (FIG. 1F) have been removed and (ii) after depositing solder balls or solder bumps 118 onto the conductive pillars 108. For example, a stenciling machine can deposit discrete blocks of solder paste onto the conductive pillars 108 and the solder paste can then be reflowed to form the solder balls 118 on the conductive pillars 108.

Notably, one drawback of the prior art process illustrated with reference to FIGS. 1A-1G is that after removing the carrier 110, the carrier 110 cannot be reused in subsequent processing stages (e.g., during the fabrication of another semiconductor device 100). In particular, because the carrier 110 must be planarized (FIG. 1C) to account for warpage caused by the adhesive layer 112 (FIG. 1B), the carrier 110 is unsuitable for use in many additional semiconductor manufacturing processes.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
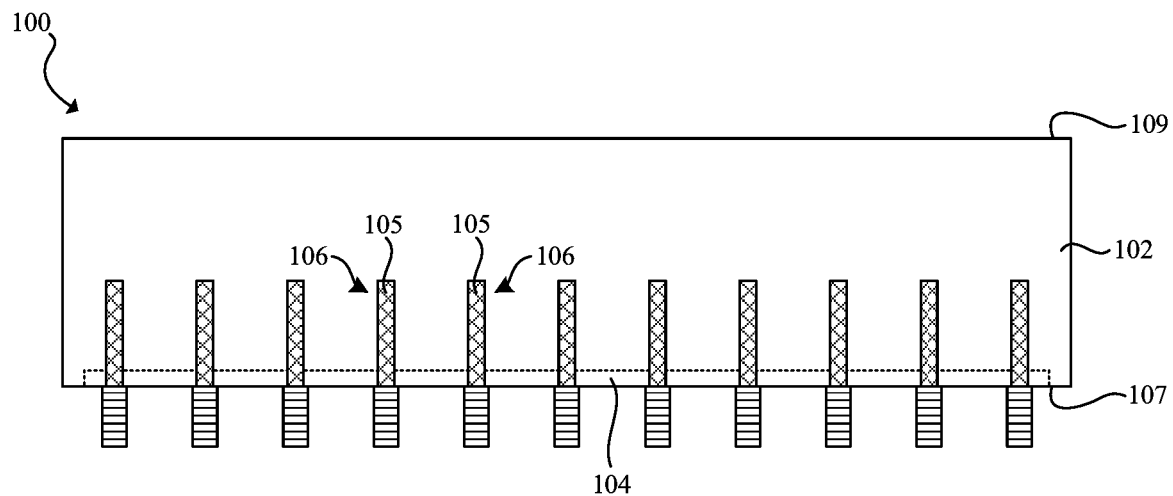
FIGS. 1A-1G are cross-sectional views illustrating various stages in a method of manufacturing a semiconductor device in accordance with the prior art.
Figure 1B:
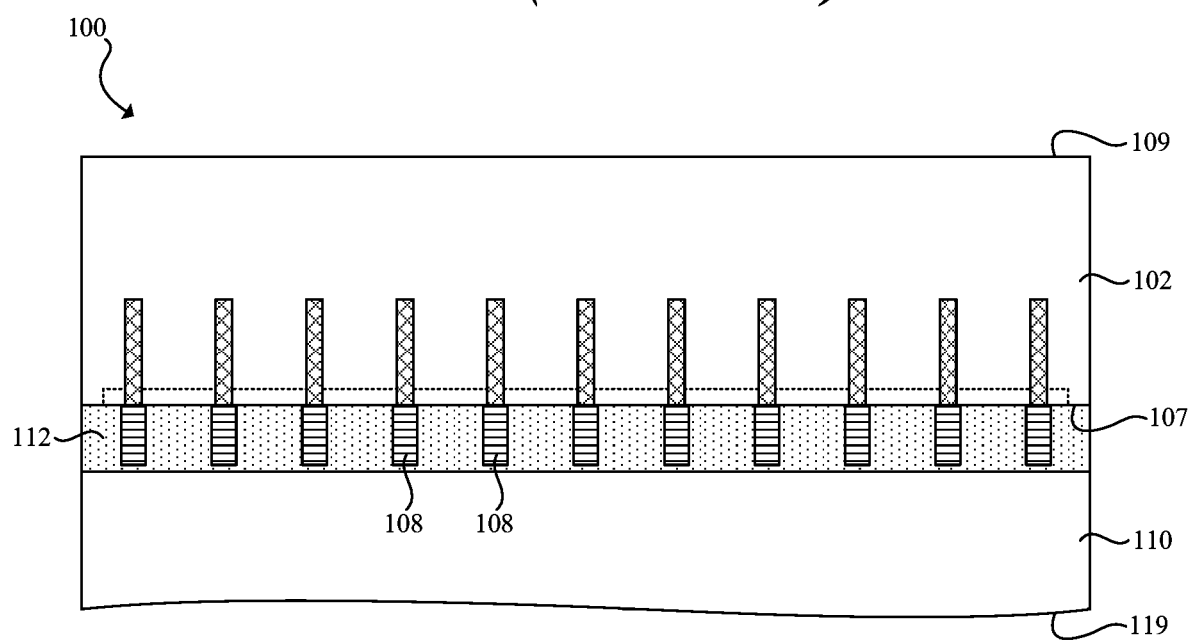
Figure 1C:
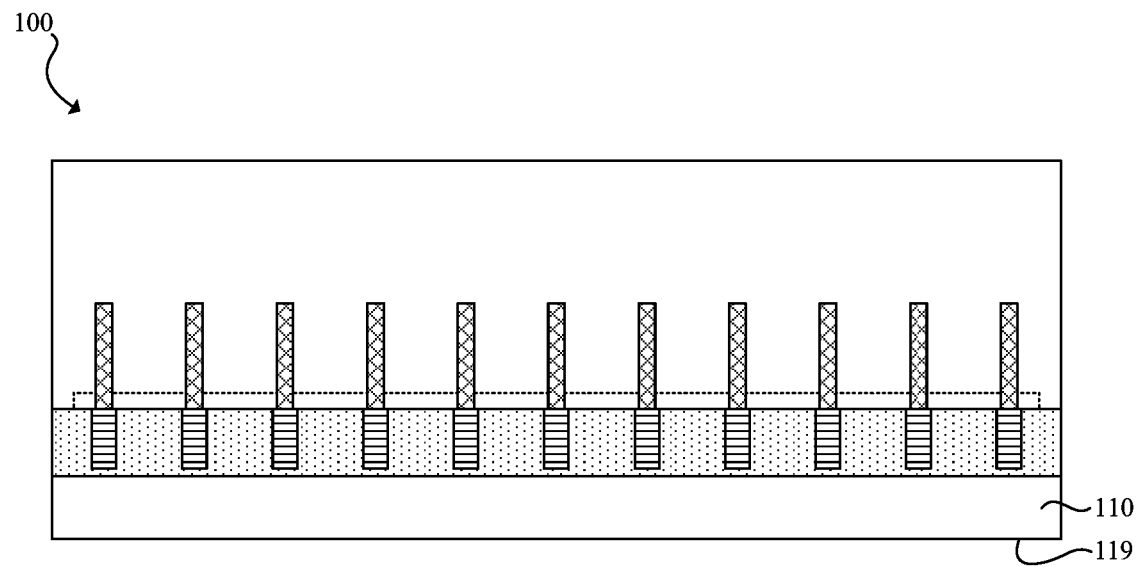
Figure 1D:
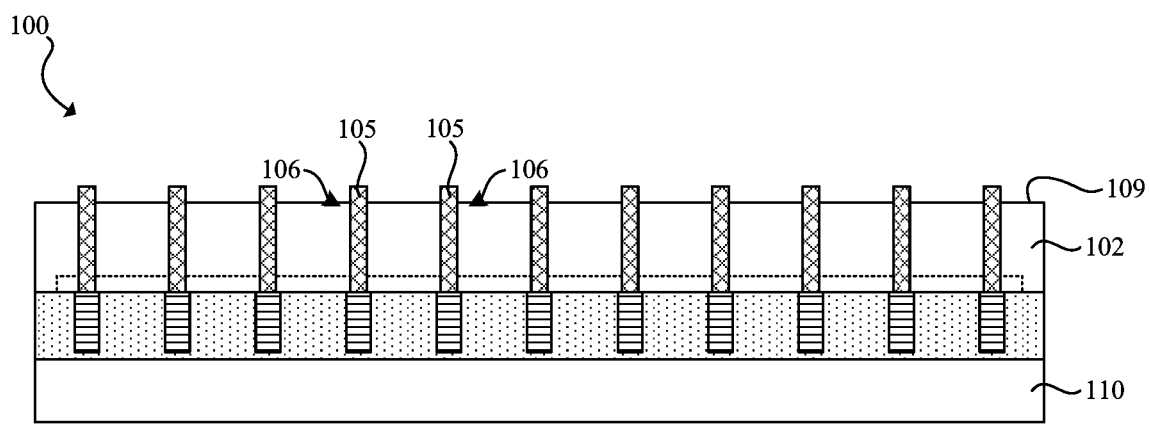
Figure 1E:
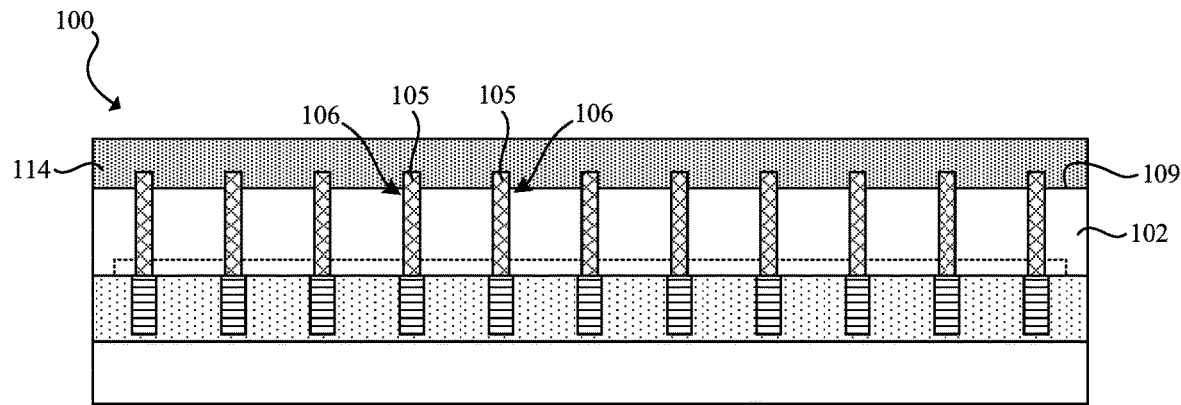
Figure 1F:
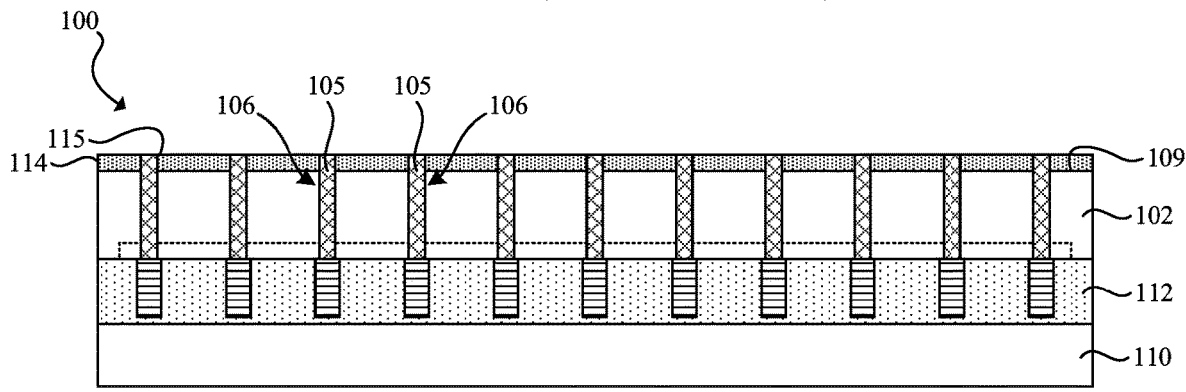
Figure 1G:
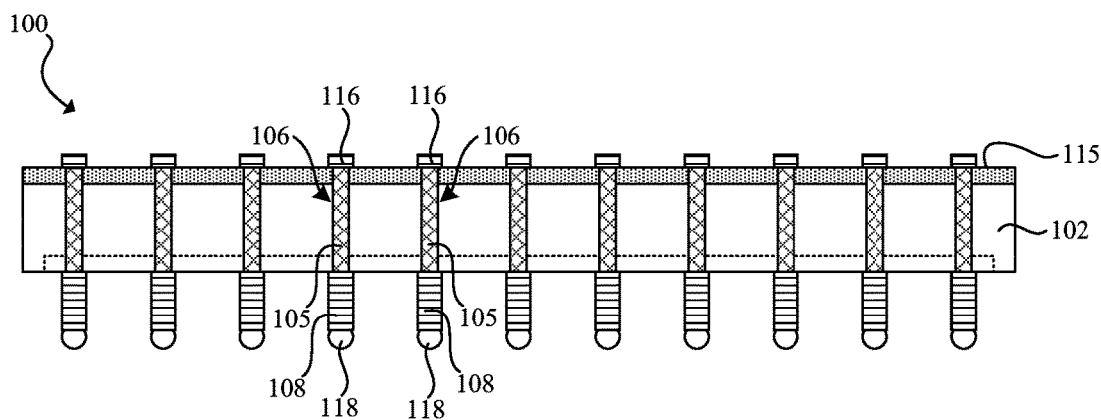

Specific details of several embodiments of methods for fabricating semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 2A-4.

In several of the embodiments described below, a method of manufacturing a semiconductor device having TSVs includes forming under-bump metallization (UBM) features on a front side of a substrate of the semiconductor device and electrically coupled to corresponding ones of the TSVs. The substrate can have active circuit elements proximate to the front side. The method can further include attaching a carrier wafer to the front side of the substrate using a thin adhesive layer and subsequently thinning a back side of the substrate to reveal the TSVs. The method can also include directly forming conductive pillars that are taller than the UBM features on and/or around exposed portions of the TSVs. The carrier can then be decoupled from the substrate and reused in additional semiconductor manufacturing processes.

Forming the UBM structures on the front side of the substrate—as opposed to forming the taller conductive pillars thereon (e.g., as in the conventional method illustrated with reference to FIGS. 1A-1G)—enables a thinner adhesive layer to be used to couple the semiconductor device to the carrier. It is expected that the thinner adhesive layer will not cause significant warping of the carrier and, therefore, that the carrier need not be planarized prior to processing stages carried out on the back side of the substrate. Accordingly, the carrier can be reused in subsequent semiconductor manufacturing processes—reducing the cost of semiconductor manufacturing processes utilizing the carrier. In addition, in some embodiments, the conductive pillars can have a volume that is significantly greater than the volume of the exposed portions of the TSVs. Therefore, no planarization or other thinning step is required before forming the conductive pillars, further reducing manufacturing costs.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 2A:
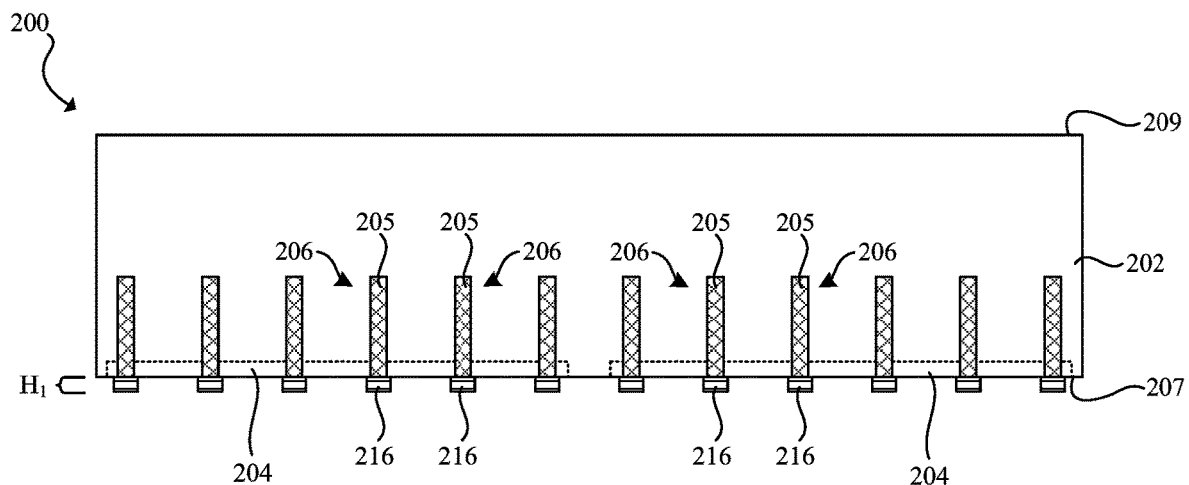
FIGS. 2A-2F are cross-sectional views illustrating various stages in a method of manufacturing a semiconductor device in accordance with embodiments of the present technology.
Figure 2B:
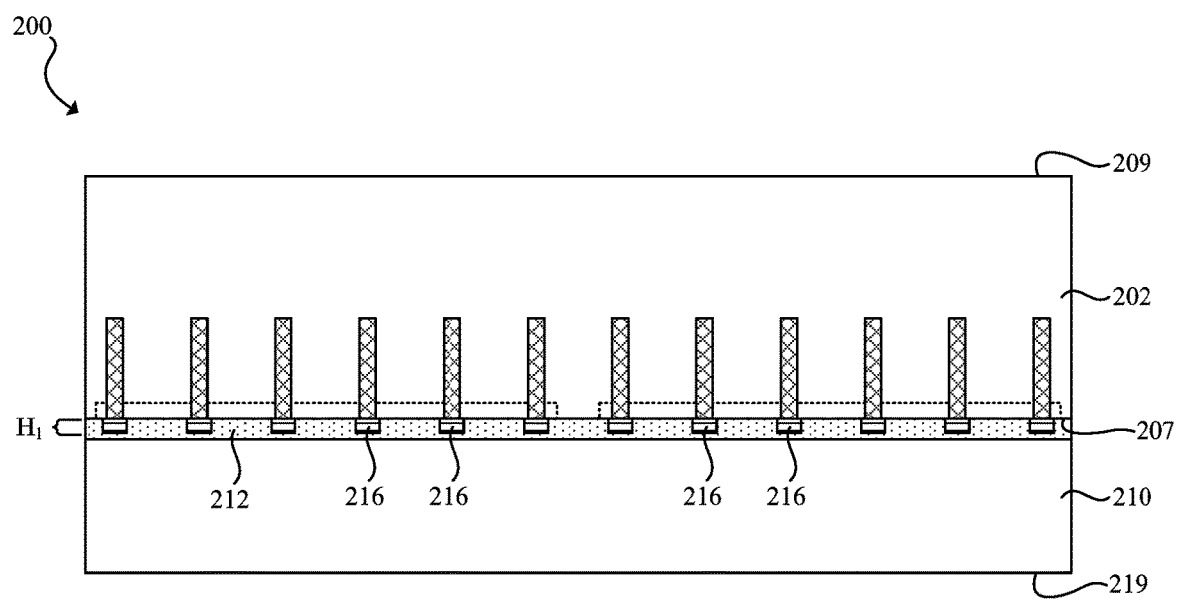
Figure 2C:
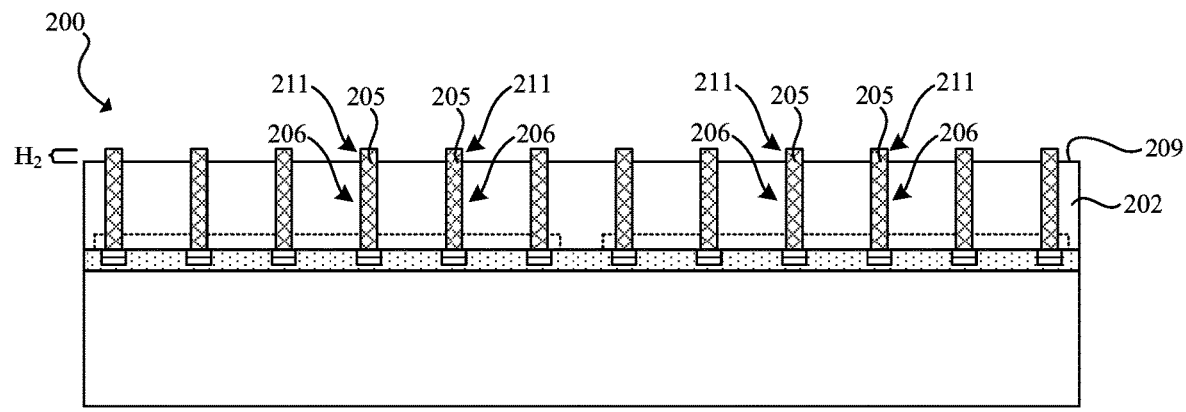
Figure 2D:
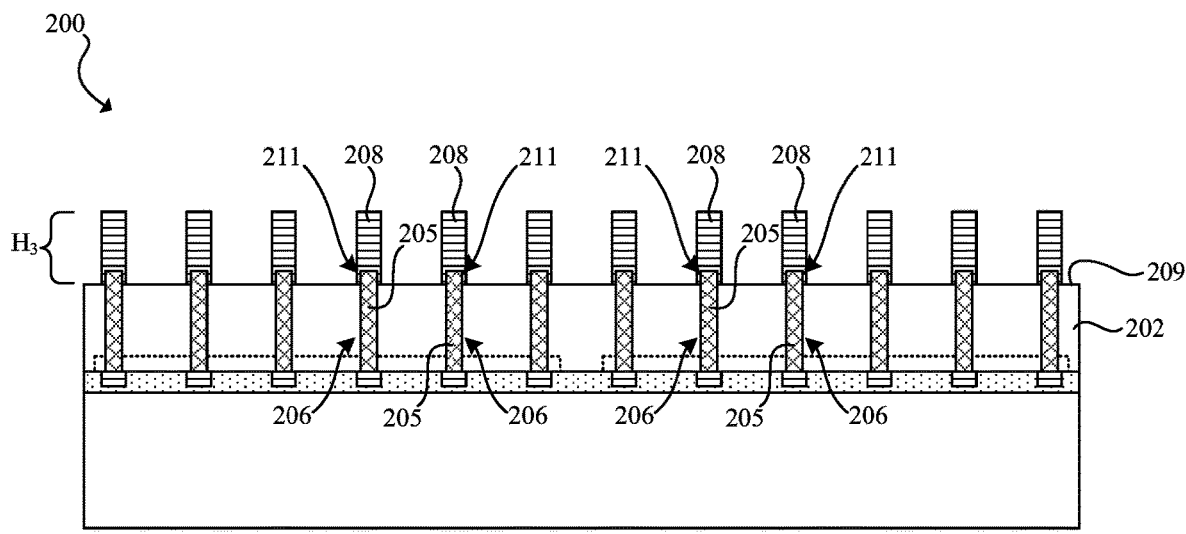
Figure 2E:
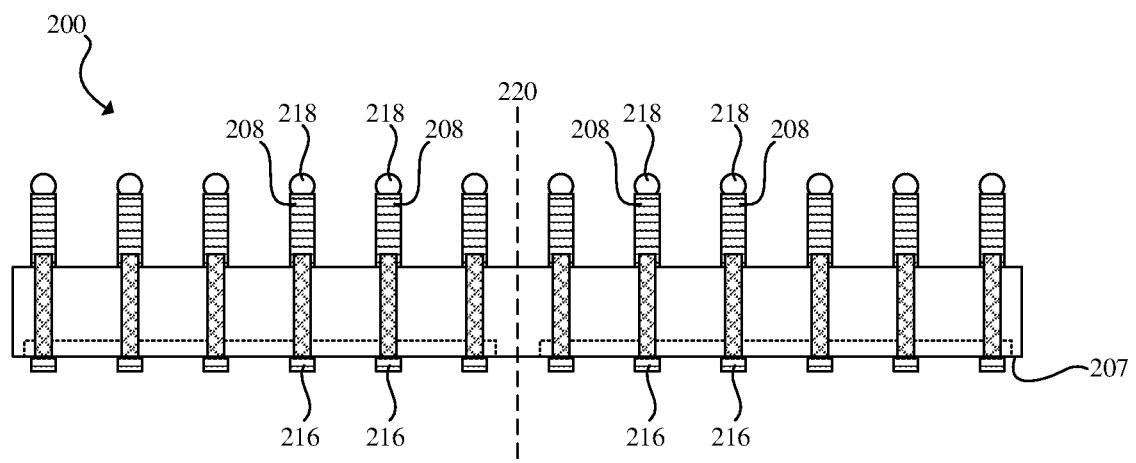
Figure 2F:
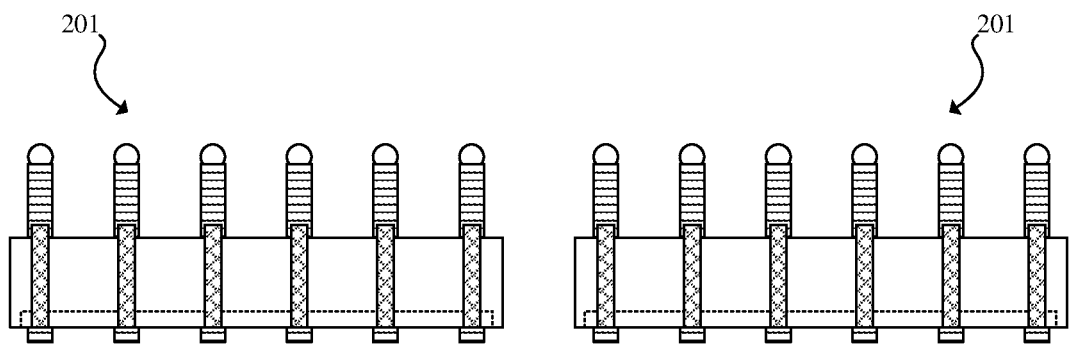

FIGS. 2A-2F are cross-sectional views illustrating various stages in a method of manufacturing a semiconductor device 200 in accordance with embodiments of the present technology. Generally, a semiconductor device can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 2A-2F illustrate the fabrication of the semiconductor device 200 which is singulatable into two individual semiconductor devices (e.g., semiconductor dies) 201 (FIG. 2F). However, one skilled in the art will readily understand that the fabrication of semiconductor device 200 can be scaled to the wafer and/or panel level—that is, to include many more components so as to be capable of being singulated into more than two semiconductor devices 201—while including similar features and using similar processes as described herein.

As shown in FIG. 2A, the semiconductor device 200 can include a substrate (e.g., a silicon substrate) 202 having a front side 207, a back side 209 opposite the front side 207, and a plurality of circuit elements (e.g., an active layer) 204 in and/or on the front side 207. For example, the circuit elements 204 can include wires, traces, interconnects, transistors, etc. In some embodiments, metal traces can be formed on the front side 207 substrate 202, while integrated circuit elements can be located in the substrate 202 beneath the metal traces. The circuit elements 204 can include, for example, a memory circuit (e.g., a dynamic random memory (DRAM)), a controller circuit (e.g., a DRAM controller), a logic circuit, and/or other circuits.

FIG. 2A further shows the semiconductor device 200 after one or more through-silicon vias (TSVs) 206 have been formed in the substrate 202. In particular, the TSVs 206 extend from the front side 207 into the substrate 202 but are not yet accessible at the back side 209 (e.g., the TSVs 206 are not exposed or revealed from the substrate 202 at the back side 209). The TSVs 206 can include a conductive material 205 that is electrically coupled to the circuit elements 204, and can be formed using well known processes in the art. For example, the TSVs 206 can be fabricated by forming (e.g., etching) holes through the front side 207 of the substrate 202 and filling the holes with the conductive material 205. The process for forming the holes can include a photolithographic process followed by one or more wet and/or dry chemical etch processes. The conductive material 205 can comprise copper, nickel, solder (e.g., SnAg-based solder), conductor-filled epoxy, and/or other electrically conductive materials. In some embodiments, the TSVs 206 can include a barrier material and/or other materials disposed between the conductive material 205 and the surrounding substrate 202.

FIG. 2A further shows the semiconductor device 200 after conductive pads (e.g., UBM features) have been formed over the front side 207 of the substrate 202 to be electrically coupled to the conductive material 205 of corresponding ones of the TSVs 206. In some embodiments, the conductive pads 216 have a height $H_1$ above the front side 207 of the substrate 202 (e.g., extend beyond the front side 207 of the substrate 202 a distance $H_1$) of between about 1-10 µm (e.g., between about 1-5 µm, less than about 5 µm, etc.). The conductive pads 216 can be fabricated by a suitable electroplating or electroless plating process, or using other suitable deposition techniques (e.g., sputter deposition). The conductive pads 216 can comprise copper, nickel, aluminum solder (e.g., SnAg-based solder), conductor-filled epoxy, and/or other electrically conductive materials, and can comprise one or more layers of the same or different conductive materials. For example, in certain embodiments, the conductive pads comprise (i) a first layer of nickel having a thickness (e.g., height above the front side 207) of about 2 µm, and (ii) a second layer of aluminum on the first layer and having a thickness of about 0.1 µm. In other embodiments, the conductive pads 216 can be a portion of a seed layer formed (e.g., deposited) on the front side 207 of the substrate 202. For example, the seed layer may be solder wettable such that a separate plating process is not required for forming the conductive pads 216. In such embodiments, the conductive pads 216 can have a thickness of between about 0.1-1 µm.

FIG. 2B shows the semiconductor device 200 after the substrate 202 has been attached to a carrier 210 via an adhesive layer 212. The carrier 210 can provide mechanical support for subsequent processing stages on the back side 209 of the substrate 202 before it is subsequently decoupled (e.g., released, removed, etc.) from the substrate 202. The carrier 210 can be a temporary carrier formed from, e.g., silicon, silicon-on-insulator, compound semiconductor (e.g., Gallium Nitride), glass, or other suitable materials. The adhesive layer 212 can be a disposable film (e.g., a laminate film of epoxy-based material) or other suitable material that secures the carrier 210 to the front side 207 of the substrate 202 and/or the conductive pads 216.

As shown in FIG. 2B, the adhesive layer 212 can have a thickness that is greater than the height $H_1$ of the conductive pads 216 and can therefore be formed to entirely or partially surround the conductive pads 216. Accordingly, in certain embodiments, the adhesive layer 212 can have a thickness of between about 1-30 µm (e.g., between about 5-10 µm, between about 10-20 µm, etc.). In comparison to the conventional method illustrated with reference to FIGS. 1A-1G, the total volume of the adhesive layer 212 can be reduced since the adhesive layer 212 can have a thickness that is equal to or only slightly greater than the relatively short conductive pads 216 formed on the front side 207 of the substrate 202. In some embodiments, the adhesive layer 212 is thin enough (e.g., has a small enough volume) that any adhesive force imparted by the adhesive layer 212 does not cause significant warping of the carrier 210, the substrate 202, and/or other components of the semiconductor device 200. For example, in some embodiments, the carrier 210 can include a back side 219 that remains generally coplanar after coupling the carrier 210 to the substrate 202 via the adhesive layer 212. Accordingly, the back side 219 of the carrier 210 does not need to be planarized prior to subsequent processing steps carried out on the back side 209 of the substrate 202. Additionally, the risk of the adhesive layer 212 damaging the substrate 202 or the conductive pads 216 while the carrier 210 is coupled to or later decoupled from the semiconductor device 200 is reduced.

FIG. 2C shows the semiconductor device 200 after the back side 209 of the substrate 202 has been thinned to expose the conductive material 205 of the TSVs 206 through the back side 209 of the substrate. The substrate 202 can be thinned using, for example, a suitable backgrinding process known in the art. As shown in FIG. 2C, after thinning the substrate 202, a projecting portion 211 of the conductive material 205 in each of the TSVs 206 can project beyond the back side 209 of the substrate 202. In some embodiments, the projecting portion 211 of the conductive material 205 in each of the TSVs 206 can have a height $H_2$ above the back side 209 of the substrate 202 (e.g., can extend beyond the back side 209 of the substrate 202 a distance $H_2$) of between about 1-10 µm (e.g., less than about 2 µm, less than about 5 µm, etc.). In certain embodiments, the height $H_2$ is about 4 µm. In some embodiments, the height $H_2$ is generally the same for each of the projecting portions 211 while, in other embodiments, the height $H_2$ of the projecting portions 211 may vary. For example, the backgrinding process used to reveal the conductive material 205 of the TSVs 206 may over and/or under polish the back side 209 of the substrate 202 in certain areas such that the conductive material 205 is not uniformly revealed. Moreover, in some embodiments, the conductive material 205 does not project beyond the back side 209 of the substrate 202 after backgrinding. For example, in such embodiments, the back side 209 of the substrate 202 can be coplanar with an upper surface of the conductive material 205 of the TSVs 206.

FIG. 2D shows the semiconductor device 200 after conductive pillars 208 have been formed on the back side 209 of the substrate 202 to be electrically coupled to the conductive material 205 of corresponding ones of the TSVs 206. In the embodiment illustrated in FIG. 2D, the conductive pillars 208 are formed to surround (e.g., cap) the projecting portions 211 of the conductive material 205 in the TSVs. In some embodiments, the conductive pillars 208 can only partially surround the projecting portions 211 (e.g., be disposed adjacent to fewer than all sides of the projecting portions 211 and/or adjacent to less than a total surface area of the projecting portions 211). In certain embodiments, where the conductive material 205 does not project beyond the back side 209 of the substrate 202, the conductive pillars 208 can be formed over all or a part of the conductive material 205 exposed at the back side 209 of the substrate 202.

In some embodiments, the conductive pillars 208 have a height $H_3$ above the back side 209 of the substrate 202 (e.g., extend beyond the back side 209 of the substrate 202 a distance $H_3$) of between about 10-100 µm (e.g., between about 35-100 µm, between about 35-60 µm, etc.). Notably, the conductive pillars 208 can be substantially taller than the conductive pads 216. For example, in some embodiments, the height $H_3$ can be at least about five times greater than the height $H_1$. In other embodiments, height $H_3$ can be about two times, ten times, etc., greater than the height $H_1$. The conductive pillars 208 can be fabricated by a suitable electroplating or electroless plating process, or using other suitable deposition techniques (e.g., sputter deposition). The conductive pillars 208 can comprise copper, nickel, aluminum solder (e.g., SnAg-based solder), conductor-filled epoxy, and/or other electrically conductive materials, and can comprise one or more layers of the same or different conductive materials. In some embodiments, the conductive pillars 208 include one or more seed layers suitable for facilitating a plating process.

Notably, the volume of the conductive pillars 208 can be substantially greater (e.g., about two times greater, five times greater, ten times greater, etc.) than the volume of the projecting portions 211 of the conductive material 205, as the height $H_3$ of the conductive pillars 208 is greater (e.g., substantially greater) than the height $H_2$ of the projecting portions 211 and, in some embodiments, the conductive pillars 208 surround the projecting portions 211 such that they have a greater (e.g., substantially greater) lateral thickness. Accordingly, in some embodiments, the conductive pillars 208 can be fabricated directly over and/or around the projecting portions 211 without requiring any intermediate step to planarize the projecting portions 211. That is, the extent to which the TSVs are "revealed" during the thinning process (FIG. 2C) is reduced in importance since any non-planarity, irregularity, variability, etc., of the projecting portions 211 is subsumed (e.g., compensated for) by the greater volume of the conductive pillars 208. For example, in comparison to the conventional method illustrated with reference to FIGS. 1A-1G, the semiconductor device 200 can be manufactured without forming a dielectric or other layer on the back side 209 of the substrate 202 and, therefore, without subsequently thinning (e.g., via a chemical mechanical planarization (CMP) process) the dielectric material and/or the conductive material 205 to form a planar back side surface of the semiconductor device 200. As a result, in some embodiments, the semiconductor device 200 does not include a dielectric layer between the conductive pillars 208 and the substrate 202, and the conductive pillars 208 directly contact the projecting portions 211 and the substrate 202. Likewise, in some embodiments the projecting portions 211 are not coplanar. The omission of such planarization and/or dielectric deposition stages is expected to reduce manufacturing costs as compared to, for example, conventional processes.

FIG. 2E illustrates the semiconductor device 200 after the carrier 210 and adhesive layer 212 (FIG. 2D) have been removed. In some embodiments, the adhesive layer 212 allows the carrier 210 to be easily removed from the semiconductor device 200 via a vacuum, poker pin, laser or other light source, or other suitable method such that the carrier 210 can be reused again. Removing the carrier 210 and the adhesive layer 212 exposes the front side 207 of the substrate 202 and the conductive pads 216.

FIG. 2E further illustrates the semiconductor device 200 after conductive features (e.g., solder balls or solder bumps) 218 have been deposited onto (e.g., formed on) the conductive pillars 208. For example, a stenciling machine can deposit discrete blocks of solder paste onto the conductive pillars 208 and the solder paste can then be reflowed to form solder balls or solder bumps on the conductive pillars 208. As further shown in FIG. 2E, singulating lanes 220 can be provided along the semiconductor device 200 to, for example, facilitate singulation of the semiconductor device 200 into a plurality of smaller semiconductor devices (e.g., semiconductor dies). Accordingly, FIG. 2F shows the semiconductor device 200 after being singulated to form two semiconductor dies 201. Specifically, the substrate 202 can be cut at the singulating lane 220 (FIG. 2E) to separate the semiconductor dies 201 from one another. Once singulated, the individual semiconductor dies 201 can be attached to external circuitry (e.g., identical semiconductor dies) via the conductive features 218 and/or via the conductive pads 216, and thus incorporated into a myriad of systems and/or devices.

Figure 3:
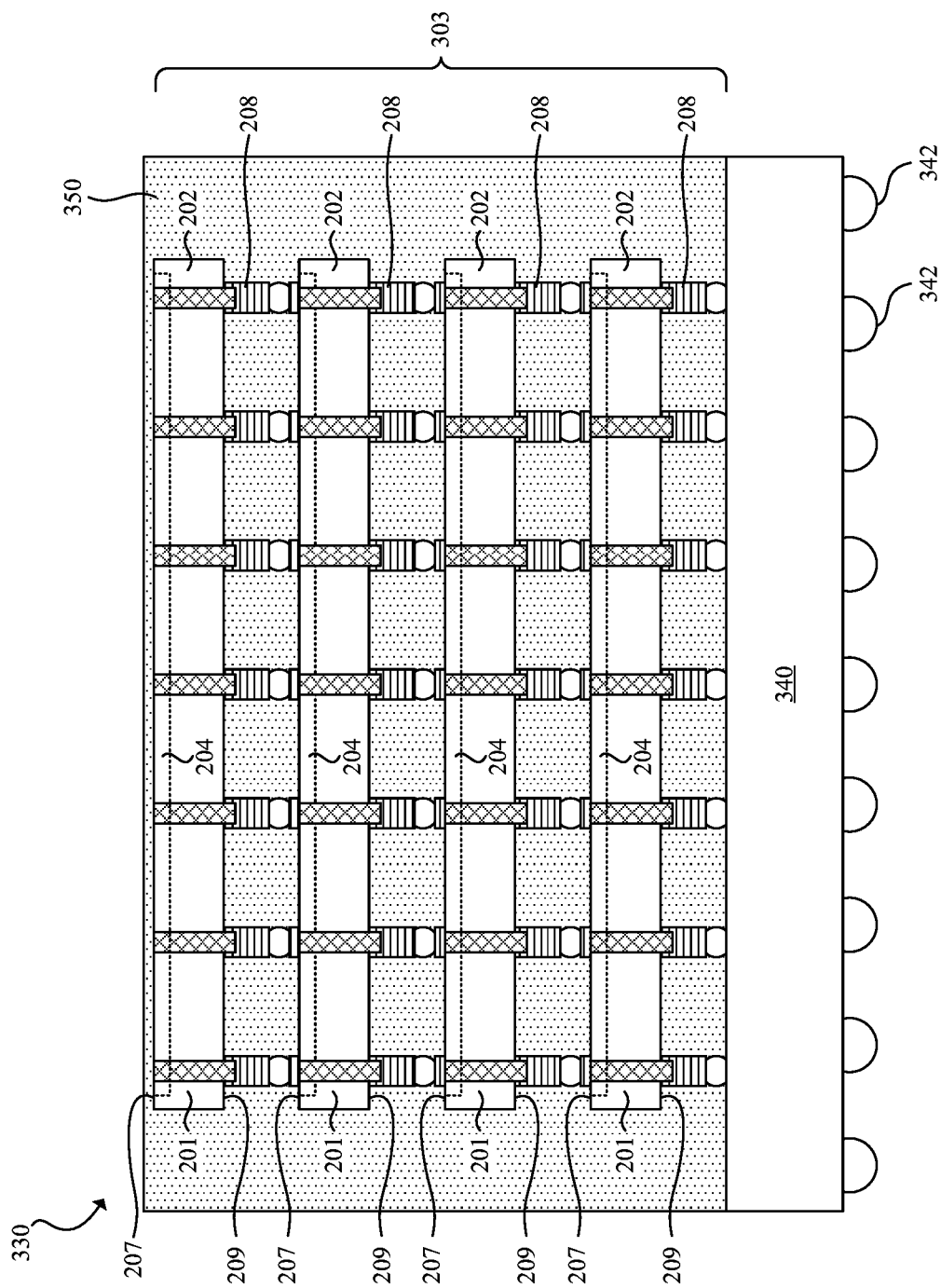
FIG. 3 is a cross-sectional view of a semiconductor device assembly in accordance with embodiments of the present technology.

For example, FIG. 3 is a cross-sectional view of a semiconductor device assembly 330 ("assembly 330") in accordance with embodiments of the present technology. The assembly 330 includes a plurality of the semiconductor dies 201 (FIG. 2F) arranged in a stack 303 on a package substrate 340. In the embodiment illustrated in FIG. 3, the assembly 330 includes four semiconductor dies 201 arranged in a "front-to-back" configuration (e.g., the front, active, side 207 of the semiconductor dies 201 faces the back side 209 of an adjacent one of the semiconductor dies 201). Notably, in the embodiment illustrated in FIG. 3, the semiconductor dies 201 are arranged such that the front side 207 of each semiconductor die 201 faces away from the package substrate 340, while the conductive pillars 208 extend from the back side 209 of each semiconductor die 201 toward the package substrate 340. In practice, the assembly 330 can include a different number of semiconductor dies 201, such as one die, two dies, three dies, five dies, eight dies, sixteen dies, or more. Likewise, the semiconductor dies 201 may have other suitable orientations such as "front-to-front." In some embodiments, the semiconductor dies 201 can be identical (e.g., memory dies manufactured to have the same design and specifications), while in other embodiments the semiconductor dies 201 can be different from each other (e.g., different types of memory dies or a combination of controller, logic, memory, and/or other dies). For example, in some embodiments, the uppermost semiconductor die 201 does not include TSVs. In other embodiments, the uppermost semiconductor die 201 can include TSVs that are not revealed at the backside 209, and can be oriented such that the front side 207 faces the lower semiconductor dies 201 in the stack 303.

For example, in one embodiment the top die can be a die without TSVs, or can be a die in which the TSVs aren't revealed by orienting it with an active surface downward, unlike what's shown in FIG. 3"

The package substrate 340 can include a redistribution layer, an interposer, a printed circuit board, a dielectric spacer, another semiconductor die (e.g., a logic die), or another suitable substrate. The package substrate 340 can further include electrical connectors 342 (e.g., solder balls, conductive bumps, conductive pillars, conductive epoxies, and/or other suitable electrically conductive elements) electrically coupled to the package substrate 340 and configured to electrically couple the semiconductor dies 201 to external devices or circuitry (not shown). As further shown in FIG. 3, a molded material 350 can be formed over the package substrate 340 and at least partially around (e.g., encapsulate) the semiconductor dies 201 to protect the semiconductor dies 201 and/or other components of the assembly 330 from external contaminants or forces that could damage the semiconductor dies 201.

Figure 4:
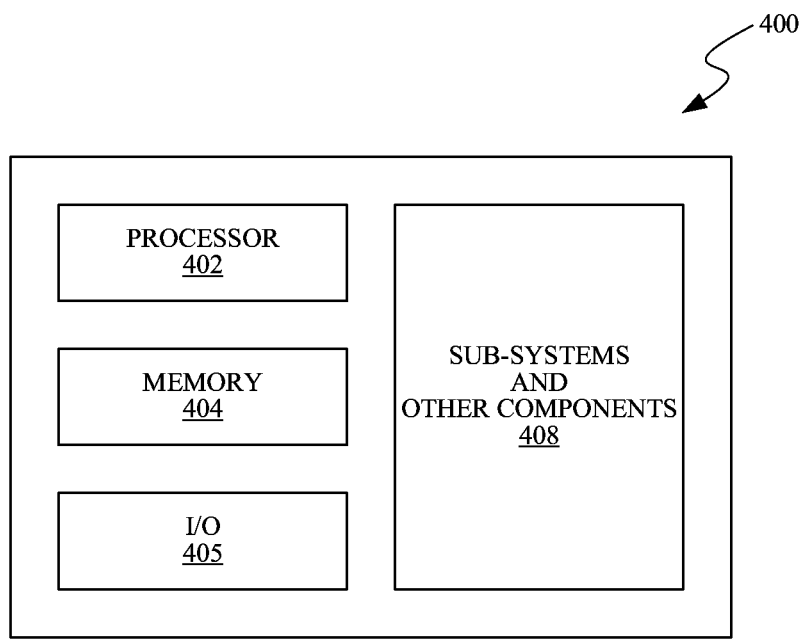
FIG. 4 is a schematic view of a system that includes a semiconductor device in accordance with embodiments of the present technology.

Any one of the semiconductor device having the features described above with reference to FIGS. 2A-3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 405, and/or other subsystems or components 408. The semiconductor dies described above with reference to FIGS. 2A-3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
    forming conductive pads on a first side of a substrate and electrically coupled to conductive material of vias extending partially through the substrate;
    removing material from a second side of the substrate such that the conductive material of the vias projects beyond the second side of the substrate to define projecting portions of the conductive material, wherein individual ones of the projecting portions have a first volume; and
    forming conductive pillars on the second side of the substrate and at least partially around the projecting portions of the conductive material, wherein individual ones of the conductive pillars have a second volume that is at least ten times greater than the first volume.

2. The method of claim 1, further comprising:
    after forming the conductive pads, coupling a carrier to the first side of the substrate via an adhesive having a thickness of less than about 30 μm.

3. The method of claim 1, further comprising:
    after forming the conductive pads, coupling a carrier to the first side of the substrate via an adhesive having a thickness of less than about 10 μm.

4. The method of claim 1, further comprising:
    after forming the conductive pads, coupling a carrier to the first side of the substrate; and
    after forming the conductive pillars, decoupling the carrier from the substrate, wherein the carrier has the same thickness before coupling the carrier to the substrate and after removing the carrier from the substrate.

5. The method of claim 1 wherein forming the conductive pads includes plating a conductive pad material at least partially onto (a) the first side of the substrate and (b) the conductive material of the vias, such that the conductive pad material has a height above the first side of the substrate of less than about 10 μm.

6. The method of claim 1 wherein forming the conductive pillars includes plating a conductive pillar material at least partially (a) onto the second side of the substrate and (b) around the projecting portions of the conductive material, such that the conductive pillar material has a height above the second side of the substrate of between about 30-100 μm.

7. The method of claim 1 wherein—
    forming the conductive pads includes plating a conductive pad material at least partially onto (a) the first side of the substrate and (b) the conductive material of the vias, such that the conductive pad material extends beyond the first side of the substrate by a first distance;
    forming the conductive pillars includes plating a conductive pillar material at least partially (a) onto the second side of the substrate and (b) around the projecting portions of the conductive material, such that the conductive pillar material extends beyond the second side of the substrate by a second distance; and
    the second distance is at least five times as great as the first distance.

8. The method of claim 1 wherein forming the conductive pads on the first side of the substrate includes forming the conductive pads proximate to an active region of the substrate.

9. The method of claim 1 wherein—
    after removing the material from the substrate, a first one of the projecting portions of the conductive material has a first height above the second side of the substrate, and a second one of the projecting portions has a second height, different from the first height, above the second side of the substrate; and
    forming the conductive pillars includes forming (a) a first one of the conductive pillars around the first one of the projecting portions and (b) a second one of the conductive pillars around the second one of the projecting portions.

10. The method of claim 9 wherein the first and second ones of the conductive pillars extend substantially the same distance above the second side of the substrate.

11. The method of claim 1 wherein the substrate is a semiconductor wafer or panel, and wherein the method further comprises dicing the substrate to form individual semiconductor dies.

12. The method of claim 1 wherein the method does not include planarizing the projecting portions of the conductive material.

13. The method of claim 1, further comprising coupling a carrier to the first side of the substrate after forming the conductive pads, and wherein the method does not include planarizing the carrier.

14. The method of claim 1 wherein the substrate includes a plurality of circuit elements proximate the first side.

15. A method of manufacturing a semiconductor device, the method comprising:
    forming a first conductive structure on a first side of a substrate and electrically coupled to a conductive via extending at least partially through the substrate;

removing material from a second side of the substrate such that an end portion of the conductive via projects beyond the second side of the substrate; and forming a second conductive structure on the second side of the substrate and at least partially around the end portion of the conductive material, wherein the second conductive structure has a volume that is at least ten times greater than a volume of the end portion of the conductive via.

16. The method of claim 15 wherein the method does not include forming an insulating layer on the second side of the substrate.

17. The method of claim 15 wherein the first conductive structure has a height above the first side of the substrate of less than about 10 µm, and wherein the second conductive structure has a height above the second side of the substrate of between about 30-100 µM.

18. The method of claim 15 wherein the second conductive structure caps the end portion of the conductive via.

19. The method of claim 15 wherein the substrate includes a plurality of circuit elements proximate the first side.

20. A method of manufacturing a semiconductor device, the method comprising:

forming a first conductive structure on a first side of a substrate and electrically coupled to a conductive material of a via extending partially through the substrate, wherein the substrate includes a plurality of circuit elements proximate the first side, and wherein the first conductive structure has a height above the first side of the substrate of less than about 10 µm;

removing material from a second side of the substrate such that the conductive material projects beyond the second side of the substrate to define a projecting portion of the conductive material, wherein the projecting portion has a first volume; and forming a second conductive structure on the second side of the substrate and at least partially around the projecting portion of the conductive material, wherein the second conductive structure has a height above the second side of the substrate of between about 30-100 µm, and wherein the second conductive structure has a second volume at least ten times greater than the first volume.

* * * * *